US011145491B2

(12) United States Patent
Murobayashi et al.

(10) Patent No.: US 11,145,491 B2
(45) Date of Patent: Oct. 12, 2021

(54) SUBSTRATE PROCESSING APPARATUS, METHOD OF MANUFACTURING SEMICONDUCTOR DEVICE AND NON-TRANSITORY COMPUTER-READABLE RECORDING MEDIUM

(71) Applicant: KOKUSAI ELECTRIC CORPORATION, Tokyo (JP)

(72) Inventors: Masaki Murobayashi, Toyama (JP); Koichiro Harada, Toyama (JP); Hiroto Igawa, Toyama (JP); Teruo Yoshino, Toyama (JP); Masanori Nakayama, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/776,693

(22) Filed: Jan. 30, 2020

(65) Prior Publication Data
US 2020/0168434 A1 May 28, 2020

Related U.S. Application Data

(63) Continuation of application No. PCT/JP2017/033044, filed on Sep. 13, 2017.

(51) Int. Cl.
*H01J 37/32* (2006.01)
*H01L 21/687* (2006.01)
(Continued)

(52) U.S. Cl.
CPC ........... *H01J 37/3211* (2013.01); *H01J 37/16* (2013.01); *H01J 37/32* (2013.01); *H01J 37/3244* (2013.01);
(Continued)

(58) Field of Classification Search
CPC ...... H01J 37/16; H01J 37/32; H01J 37/32522; H01J 37/3211; H01J 37/32284;
(Continued)

(56) References Cited

U.S. PATENT DOCUMENTS 5,525,159 A * 6/1996 Hama ................. H01J 37/3244
118/723 I
5,954,034 A 10/1999 Vinogradov et al.
(Continued)

FOREIGN PATENT DOCUMENTS

JP 58-127334 U 8/1983
JP 09-022795 A 1/1997
(Continued)

OTHER PUBLICATIONS

Japanese Utility Model Application No. S57-22829, Harumatsu Tajima, Aug. 29, 1983.*
(Continued)

*Primary Examiner* — Amy Cohen Johnson
*Assistant Examiner* — Syed M Kaiser
(74) *Attorney, Agent, or Firm* — Volpe Koenig

(57) ABSTRACT

Described herein is a technique capable of suppressing variations or deterioration in a processing rate between a plurality of substrates due to temperature. According to one aspect of the technique of the present disclosure, there is provided a substrate processing apparatus including: a process vessel constituting at least a part of a process chamber where a substrate is processed; a plasma generator comprising a coil provided to be wound around an outer periphery of the process vessel and a high frequency power supply configured to supply high frequency power to the coil; a substrate support provided in the process chamber and below a lower end of the coil; a heater provided in the substrate support; and a temperature sensor configured to
(Continued)

measure a temperature of a portion of the process vessel located above an upper end of the coil.

16 Claims, 8 Drawing Sheets

(51) Int. Cl.
*H05H 1/46* (2006.01)
*H01J 37/16* (2006.01)

(52) U.S. Cl.
CPC .. *H01J 37/32449* (2013.01); *H01J 37/32522* (2013.01); *H01L 21/68785* (2013.01); *H05H 1/46* (2013.01); *H05H 1/4652* (2021.05)

(58) Field of Classification Search
CPC ............ H01J 37/3244; H01J 37/32449; H01L 21/68785; H05H 1/46; H05H 2001/4667
See application file for complete search history.

(56) References Cited

U.S. PATENT DOCUMENTS

| | | | |
|---|---|---|---|
| 5,965,034 A * | 10/1999 | Vinogradov | H01J 37/321 216/68 |
| 6,127,275 A | 10/2000 | Flamm | |
| 6,486,081 B1 * | 11/2002 | Ishikawa | C23C 16/401 438/787 |
| 2006/0189168 A1 | 8/2006 | Sato et al. | |
| 2010/0126666 A1 * | 5/2010 | Tandou | H01L 21/67248 156/345.27 |
| 2012/0249986 A1 * | 10/2012 | Tanaka | H01J 37/32642 355/55 |
| 2014/0106573 A1 | 4/2014 | Terasaki et al. | |
| 2016/0336190 A1 * | 11/2016 | Kikuchi | C23C 16/401 |
| 2016/0372306 A1 * | 12/2016 | Voronin | H01J 37/321 |
| 2017/0330759 A1 * | 11/2017 | Gohira | H01L 21/67069 |
| 2018/0261476 A1 * | 9/2018 | Ouchi | H01L 21/67069 |
| 2019/0189437 A1 * | 6/2019 | Ouchi | H01J 37/3244 |
| 2019/0326125 A1 * | 10/2019 | Kihara | H01L 21/0228 |

FOREIGN PATENT DOCUMENTS

| | | | |
|---|---|---|---|
| JP | 2000-501568 A | | 2/2000 |
| JP | 2006-210948 A | | 8/2006 |
| JP | 2010-21590 A | | 1/2010 |
| JP | 2010-151733 A | | 7/2010 |
| JP | 2011-258615 A | | 12/2011 |
| JP | 2011258615 A | * | 12/2011 |
| JP | 2013-045933 A | | 3/2013 |
| JP | 2014-75579 A | | 4/2014 |
| JP | 2014-170634 A | | 9/2014 |
| JP | 2014170634 A | * | 9/2014 |
| WO | 2004/061929 A1 | | 7/2004 |

OTHER PUBLICATIONS

Japanese Office Action dated Sep. 1, 2020 for Japanese Patent Application No. 2019-541539.

* cited by examiner

SUBSTRATE PROCESSING APPARATUS, METHOD OF MANUFACTURING SEMICONDUCTOR DEVICE AND NON-TRANSITORY COMPUTER-READABLE RECORDING MEDIUM

CROSS-REFERENCE TO RELATED PATENT APPLICATION

This non-provisional U.S. patent application claims priority under 35 U.S.C. § 119 of International Application No. PCT/JP2017/033044, filed on Sep. 13, 2017, in the WIPO, the entire contents of which are hereby incorporated by reference.

BACKGROUND

1. Field

The present disclosure relates to a substrate processing apparatus, a method of manufacturing a semiconductor device and a non-transitory computer-readable recording medium.

2. Description of the Related Art

Recently, a semiconductor device such as a flash memory is integrated at high density. As a result, sizes of patterns of the semiconductor device are remarkably miniaturized. A predetermined process such as an oxidation process and a nitridation process on a substrate, which is one of manufacturing processes of the semiconductor, may be performed to form the patterns.

For example, according to related arts, surfaces of the patterns formed on the substrate may be modified by performing a modification process by using a plasma-excited process gas.

However, when performing a process such as the modification process on the substrate by using a substrate processing apparatus, a processing rate of the substrate processing apparatus may vary depending on a temperature of components constituting a process chamber of the substrate processing apparatus. As a result, a desired processing rate may not be obtained when the components of the process chamber are not at desired temperatures, or variations in the processing rate may occur between a plurality of substrates including the substrate performed by the substrate processing apparatus when the temperature of the process chamber is unstable.

SUMMARY

Described herein is a technique capable of suppressing variations in a processing rate between a plurality of substrates to be processed, capable of suppressing a decrease in the processing rate due to a temperature of a process vessel constituting a process chamber of a substrate processing apparatus using plasma, and capable of improving the quality of a semiconductor device.

According to one aspect of the technique of the present disclosure, there is provided a substrate processing apparatus including: a process vessel constituting at least a part of a process chamber where a substrate is processed; a plasma generator including a coil provided to be wound around an outer periphery of the process vessel and a high frequency power supply configured to supply high frequency power to the coil; a substrate support provided in the process chamber and below a lower end of the coil; a heater provided in the substrate support; and a temperature sensor configured to measure a temperature of a portion of the process vessel located above an upper end of the coil.

DETAILED DESCRIPTION

Embodiments

Figure 1:
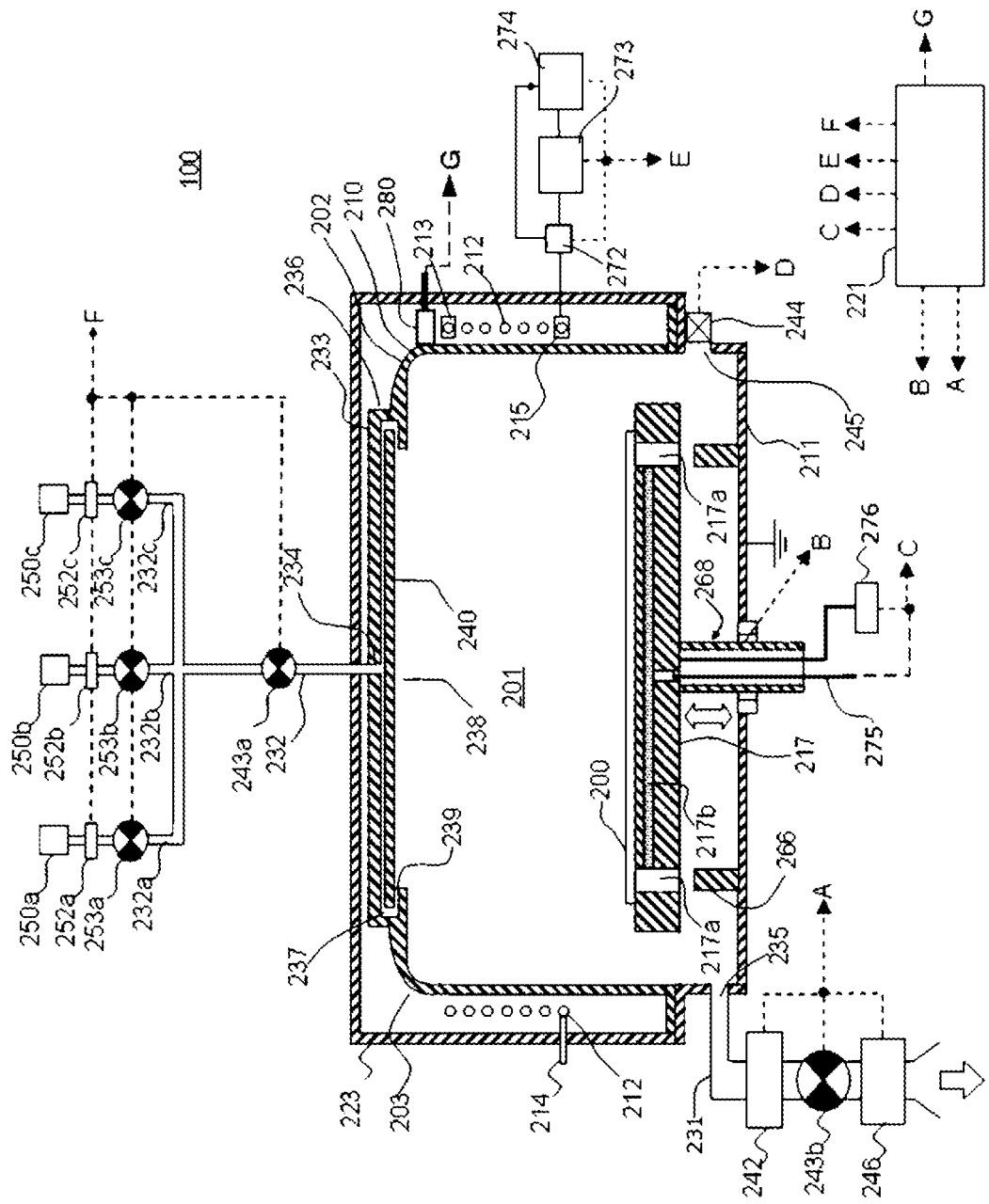
FIG. 1 schematically illustrates a vertical cross-section of a substrate processing apparatus according to one or more embodiments described herein.

Hereinafter, one or more embodiments (hereinafter, simply referred to as "embodiments") according to the technique of the present disclosure will be described. First, a first embodiment according to the technique of the present disclosure will be described.

First Embodiment of Present Disclosure

(1) Configuration of Substrate Processing Apparatus

Hereinafter, a substrate processing apparatus according to the first embodiment of the present disclosure will be described with reference to FIGS. 1 through 4. The substrate processing apparatus according to the first embodiment is mainly configured to perform an oxidation process of oxidizing a film formed on a surface of a substrate.

Process Chamber

A substrate processing apparatus 100 includes a process furnace 202 where a wafer 200 is processed by plasma. The process furnace 202 is provided with a reaction vessel (also referred to as a "process vessel") 203. A process chamber 201 is constituted by the reaction vessel 203. The reaction vessel 203 includes a dome-shaped or a cylinder-shaped upper vessel 210 serving as a first vessel and a bowl-shaped lower vessel 211 serving as a second vessel. By covering the lower vessel 211 with the upper vessel 210, the process chamber 201 is defined. The upper vessel 210 is made of quartz ($SiO_2$), which is a non-metallic material, and, for example, the lower vessel 211 is made of aluminum (Al). That is, an inner side wall of the upper vessel 210 constituting a part of an inner side wall of the process furnace 202 is made of quartz.

A loading/unloading port 245 of the wafer 200 and a gate valve 244 are provided on a lower side wall of the lower vessel 211.

The process chamber 201 includes a plasma generation space 201a that a resonance coil 212 is provided therearound and a substrate processing space 201b where the wafer 200 is processed. The substrate processing space 201b communicates with the plasma generation space 201a. The plasma generation space 201a refers to a space in the process chamber 201 above a lower end of the resonance coil 212 and below an upper end of the resonance coil. The substrate processing space 201b refers to a space where the wafer 200 is processed by the plasma, for example, a space below the lower end of the resonance coil 212.

Susceptor

A susceptor 217 serving as a part of a substrate support is provided in the substrate processing space 201b at a center of a bottom portion of the process chamber 201. The wafer 200 can be placed on the susceptor 217. The susceptor 217 is made of a non-metallic material such as aluminum nitride, ceramics and quartz.

A heater 217b serving as a heating mechanism and a thermocouple 275 serving as a temperature sensor are embedded in the susceptor 217. When electric power is supplied through a heater power adjustment mechanism 276, the heater 217b is configured to heat the wafer 200 such that a surface temperature of the wafer 200 may range, for example, from about 25° C. to about 750° C. The thermocouple 275 is installed at the susceptor 217 so as to measure a temperature of the heater 217b or a temperature of the susceptor 217 heated by the heater 217b.

A susceptor elevating mechanism 268 is provided at the susceptor 217. The susceptor elevating mechanism 268 includes a driving mechanism (not shown) configured to elevate and lower the susceptor 217. Through-holes 217a are provided at the susceptor 217. Wafer lift pins 266 are provided at a bottom of the lower vessel 211 corresponding to the through-holes 217a. When the susceptor 217 is lowered by the susceptor elevating mechanism 268, the wafer lift pins 266 pass through the through-holes 217a. The substrate support according to the first embodiment is mainly constituted by the susceptor 217, the heater 217b and the thermocouple 275.

Gas Supply System

A gas supply head 236 is provided on an upper portion of the upper vessel 210. The gas supply head 236 includes a cap-shaped lid 233, a gas inlet port 234, a buffer chamber 237, an opening portion 238, a shield plate 240 and a gas outlet port 239.

A downstream end of an oxygen gas supply pipe 232a configured to supply oxygen ($O_2$) gas, a downstream end of a hydrogen gas supply pipe 232b configured to supply hydrogen ($H_2$) gas and a downstream end of an inert gas supply pipe 232c configured to supply an argon (Ar) gas serving as an inert gas are connected to join the gas inlet port 234. An oxygen ($O_2$) gas supply source 250a, a mass flow controller (MFC) 252a serving as a flow rate controller and a valve 253a serving as an opening/closing valve are provided in order from an upstream side to a downstream side of the oxygen gas supply pipe 232a. A hydrogen ($H_2$) gas supply source 250b, an MFC 252b and a valve 253b are provided in order from an upstream side to a downstream side of the hydrogen gas supply pipe 232b. An argon (Ar) gas supply source 250c, an MFC 252c and a valve 253c are provided in order from an upstream side to a downstream side of the inert gas supply pipe 232c. A valve 243a is provided on a downstream side where the oxygen gas supply pipe 232a, the hydrogen gas supply pipe 232b and the inert gas supply pipe 232c join. The valve 243a is connected to an upstream end of the gas inlet port 234. It is possible to supply the process gas such as the $O_2$ gas, the $H_2$ gas and the inert gas into the process chamber 201 via the gas supply pipes 232a, 232b and 232c by opening and closing the valves 253a, 253b, 253c and 243a while adjusting the flow rates of the respective gases by the MFCs 252a, 252b and 252c.

A gas supply system (also referred to as a "gas supply mechanism") according to the first embodiment is mainly constituted by the gas supply head 236, the oxygen gas supply pipe 232a, the hydrogen gas supply pipe 232b, the inert gas supply pipe 232c, the MFCs 252a, 252b and 252c and the valves 253a, 253b, 253c and 243a.

Exhaust System

A gas exhaust port 235 is provided on a side wall of the lower vessel 211. An inner atmosphere of the process chamber 201 such as a reactive gas is exhausted from the process chamber 201 through the gas exhaust port 235. An upstream end of a gas exhaust pipe 231 is connected to the gas exhaust port 235. An APC (Automatic Pressure Controller) valve 242 serving as a pressure controller (pressure adjusting mechanism), a valve 243b serving as an opening/closing valve and a vacuum pump 246 serving as a vacuum exhaust device are provided in order from an upstream side to a downstream side of the gas exhaust pipe 231. An exhaust system (also referred to as an "exhaust mechanism") according to the first embodiment is mainly constituted by the gas exhaust port 235, the gas exhaust pipe 231, the APC valve 242 and the valve 243b. The exhaust system may further include the vacuum pump 246.

Plasma Generator

The resonance coil 212 of a helical shape is provided so as to surround the process chamber 201 around an outer peripheral portion of the process chamber 201, that is, around an outer portion of a side wall of the upper vessel 210. The resonance coil 212 is provided so as to be wound around an outer periphery of the plasma generation space 201a, and constitutes an inductive coupling structure. An RF sensor 272, a high frequency power supply 273 and a matching mechanism 274 configured to match an impedance or an output frequency of the high frequency power supply 273 are connected to the resonance coil 212.

The high frequency power supply 273 supplies a high frequency power to the resonance coil 212. The RF sensor 272 is provided at an output side of the high frequency power supply 273. The RF sensor 272 is configured to monitor information of the traveling wave or reflected wave of the high frequency power supplied to the resonance coil 212. The reflected wave monitored by the RF sensor 272 is input to the matching mechanism 274.

A winding diameter, a winding pitch and the number of winding turns of the resonance coil 212 are set such that the resonance coil 212 resonates at a constant wavelength to form a standing wave of a predetermined wavelength. That is, an electrical length of the resonance coil 212 is set to an integral multiple of a wavelength of a predetermined frequency of the high frequency power supplied from the high frequency power supply 273.

Specifically, the resonance coil 212 having an effective cross-section of 50 $mm^2$ to 300 $mm^2$ and a diameter of 200 mm to 500 mm is wound, for example, twice to 60 times around an outer peripheral side of the upper vessel 210 such that the magnetic field of about 0.01 Gauss to about 10 Gauss can be generated by the high frequency power having a frequency of 800 kHz to 50 MHz and a power of 0.5 KW to 5 KW, for example.

According to the first embodiment, for example, the frequency of the high frequency power is set to 27.12 MHz, and the electrical length of the resonance coil 212 is set to be equal to a length of the wavelength of the predetermined frequency (about 11 meters).

Both ends of the resonance coil 212 are electrically grounded. One end of the resonance coil 212 is electrically grounded via a movable tap 213. A reference numeral 214 in FIG. 1 indicates a fixed ground of the other end of the resonance coil 212. A position of the movable tap 213 may be adjusted so that the resonance characteristics of the resonance coil 212 are substantially equal to those of the high frequency power source 273. In addition, in order to fine-tune an impedance of the resonance coil 212, a power feeding part (not shown) is constituted by a movable tap 215 between the grounded ends of the resonance coil 212.

A shield plate 223 is provided to shield an electric field outside the resonance coil 212 and to form a capacitive component of the resonance coil 212 necessary for constructing a resonance circuit with the resonance coil 212.

The plasma generator according to the first embodiment is mainly constituted by the resonance coil 212, the RF sensor 272 and the matching mechanism 274. The plasma generator may further include the high frequency power supply 273.

Figure 2:
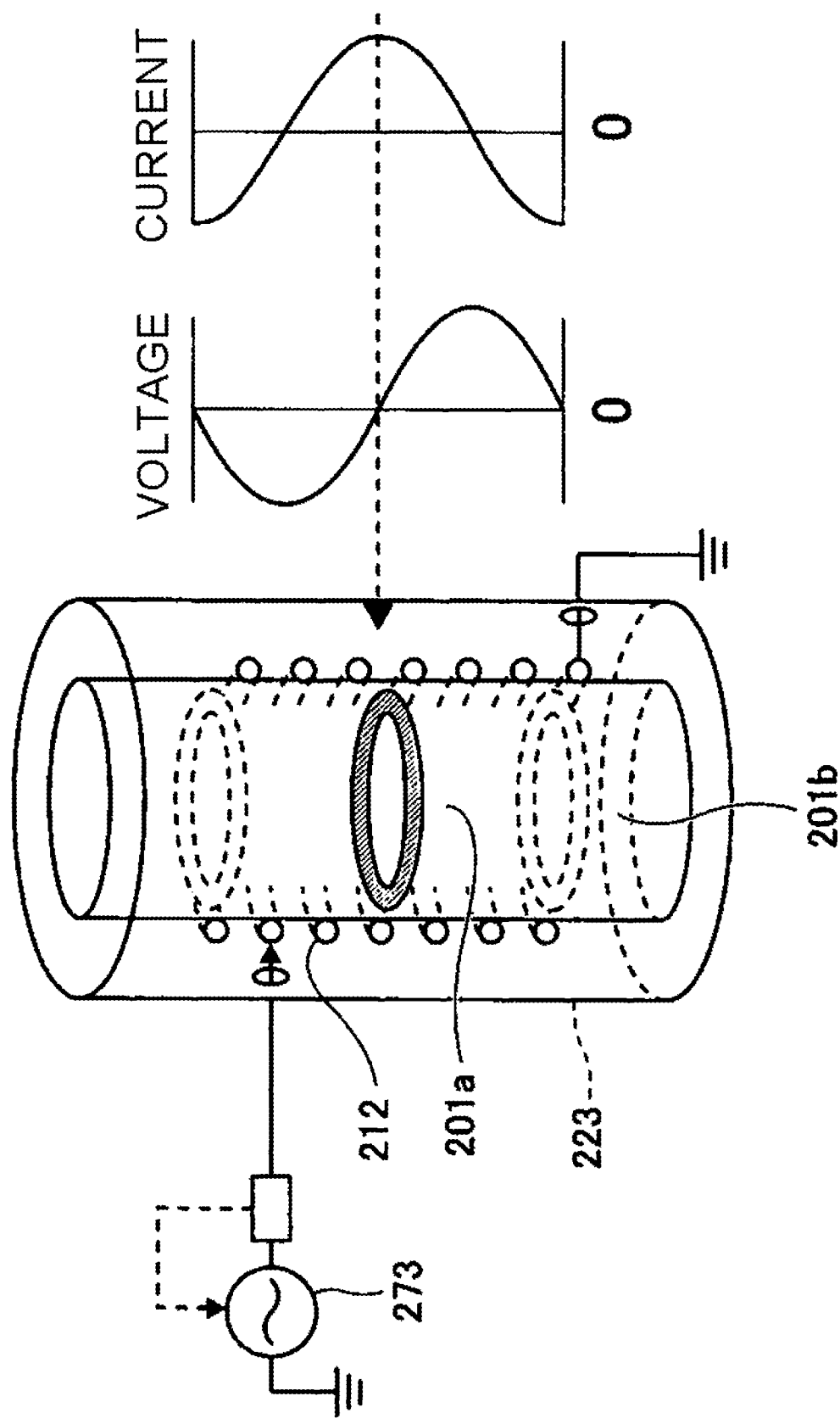
FIG. 2 schematically illustrates a principle of generating plasma in the substrate processing apparatus according to the embodiments described herein.

Hereinafter, a principle of generating plasma in the substrate processing apparatus 100 according to the first embodiment and the properties of the generated plasma will be described with reference to FIG. 2. According to the first embodiment, in order to compensate for a resonance shift in the resonance coil 212 when the plasma is generated by adjusting the power supplied from the high frequency power supply 273, the power of the reflected wave from the resonance coil 212 when the plasma is generated is detected by the RF sensor 272, and the matching mechanism 274 corrects the output of the high frequency power supply 273 based on the detected power of the reflected wave.

Specifically, the matching mechanism 274 is configured to increase or decrease the impedance or the output frequency of the high frequency power supply 273 such that the power of the reflected wave from the resonance coil 212 detected by the RF sensor 272 when the plasma is generated is minimized. In case the impedance is controlled by the matching mechanism 274, the matching mechanism 274 is configured as a variable capacitor control circuit capable of correcting a preset impedance. In case the output frequency of the high frequency power supply 273 is controlled by the matching mechanism 274, the matching mechanism 274 is configured by a frequency control circuit capable of correcting a preset oscillation frequency of the high frequency power supply 273.

According to the configuration of the resonance coil 212 described above, the high frequency power whose frequency is equal to an actual resonance frequency of the resonance coil 212 combined with the plasma is supplied to the resonance coil 212 (or the high frequency power is supplied to match the actual impedance of the resonance coil 212 combined with the plasma). Therefore, the standing wave in which the phase voltage thereof and the opposite phase voltage thereof are always canceled out by each other is generated in the resonance coil 212, and the highest phase current is generated at an electric midpoint of the resonance coil 212 (node with zero voltage). Therefore, the induction plasma excited in the vicinity of the electric midpoint in the plasma generation space 201a is hardly capacitively coupled with walls of the process chamber 201 or the susceptor 217. As a result, as shown in FIG. 2, a donut-shaped induction plasma (also referred to as a "ring-shaped induction plasma") with extremely low electric potential is generated in the vicinity of the electric midpoint in the plasma generation space 201a. In addition, the induction plasma excited in the vicinities of an electrical start point and an electrical end point of the resonance coil 212 (that is, the upper and lower ends of the resonance coil 212) in the plasma generation space 201a is hardly capacitively coupled with the walls of the process chamber 201 or the susceptor 217. As a result, as shown in FIG. 2, the donut-shaped induction plasma with extremely low electric potential is generated in the vicinities of the electrical start point and the electrical end point of the resonance coil 212 in the plasma generation space 201a. That is, according to the first embodiment, the doughnut-shaped induction plasma with a high plasma density is generated at the heights of the upper end, a middle point (that is, the electric midpoint) and the lower end of the resonance coil 212.

Temperature Sensor

A thermocouple mechanism 280 serving as a temperature sensor arranged to measure a temperature of an outer peripheral surface of the upper vessel 210 is provided at the outer portion of the upper vessel 210. By a pressing mechanism described later presses the thermocouple mechanism 280 against the outer peripheral surface of the upper vessel 210, a temperature detection point of the thermocouple mechanism 280 is in contact with the outer peripheral surface of the upper vessel 210. The thermocouple mechanism 280 may be simply referred to as a thermocouple 280.

The thermocouple mechanism 280 is provided (installed) so as to measure a temperature of the outer peripheral surface of the upper vessel 210, in particular, a temperature of a portion of the outer peripheral surface of the upper vessel 210 located above the upper end of the resonance coil 212. Specifically, for example, it is preferable to install the thermocouple mechanism 280 so as to measure the temperature of the outer peripheral surface at a predetermined position 10 mm to 50 mm above the upper end of the resonance coil 212, more preferably, 15 mm to 30 mm above the upper end of the resonance coil 212. According to the first embodiment, the predetermined position is set 30 mm above the upper end of the resonance coil 212.

That is, when the thermocouple mechanism 280 is provided at a position too close to the resonance coil 212, noise may be generated in a temperature detection signal from the thermocouple mechanism 280 and the electrical characteristics of the resonance coil 212 may be substantially affected due to the high frequency electromagnetic field generated from the resonance coil 212. Accordingly, it is preferable that the thermocouple mechanism 280 is provided at least 10 mm or more, preferably 15 mm or more away from the upper end of the resonance coil 212.

In addition, for the following reason, it is preferable that the thermocouple mechanism 280 is provided so as to measure the temperature at the position of the outer peripheral surface as close to the upper end of the resonance coil 212 as possible.

The plasma discharge is generated more intensively at the positions in the vicinities of the upper end, the middle point and lower end of the resonance coil 212 than at other positions. Therefore, portions of the upper vessel 210 corresponding thereto are heated intensively by the plasma discharge. According to the first embodiment, as described above, by installing the thermocouple mechanism 280 as close as possible to the upper end of the resonance coil 212, it is possible to measure a temperature of a portion of the upper vessel 210 heated by the plasma discharge generated intensively in the vicinity of the upper end of the resonance coil 212 (or a portion close thereto). Therefore, it is possible to detect a temperature change of the upper vessel 210 due to the plasma discharge generated in the upper vessel 210 with better responsiveness by using the thermocouple mechanism 280 than by using thermocouples provided at other positions. Therefore, it is preferable that the thermocouple mechanism 280 is installed at a position within at least 50 mm, preferably within 30 mm from the upper end of the resonance coil 212.

In addition, when measuring the temperature of the outer peripheral surface of the upper vessel 210, a thermocouple may be provided at a position below the lower end of the resonance coil 212. However, since the position below the lower end of the resonance coil 212 is relatively close to the susceptor 217, the position below the lower end of the resonance coil 212 may be easily influenced by the heat (particularly the radiant heat) from the heater 217b provided in the susceptor 217. Therefore, the position below the lower end of the resonance coil 212 is inappropriate as a position where to detect the temperature change of the upper vessel 210 with good responsiveness to the plasma discharge. In particular, when heating is performed by the heater 217b before the start of the plasma discharge, the temperature of the portion below the lower end of the resonance coil 212 of the upper vessel 210 rises locally due to the influence of the heat such as the radiant heat from the heater 217b. Therefore, the position below the lower end of the resonance coil 212 of the upper vessel 210 is inappropriate as the position where to detect the temperature change of the upper vessel 210 due to the plasma discharge.

In addition, when measuring the temperature of the outer peripheral surface of the upper vessel 210, a thermocouple may be provided at a position in the vicinity of the middle point of the resonance coil 212. However, when the thermocouple is to be provided at the position in the vicinity of the middle point of the resonance coil 212, since it is necessary to provide the thermocouple between the windings of the resonance coil 212, the thermocouple tends to affect the electrical characteristics of the resonance coil 212. Therefore, the position in the vicinity of the middle point of the resonance coil 212 is also inappropriate as the position where the thermocouple is provided.

Figure 4A:
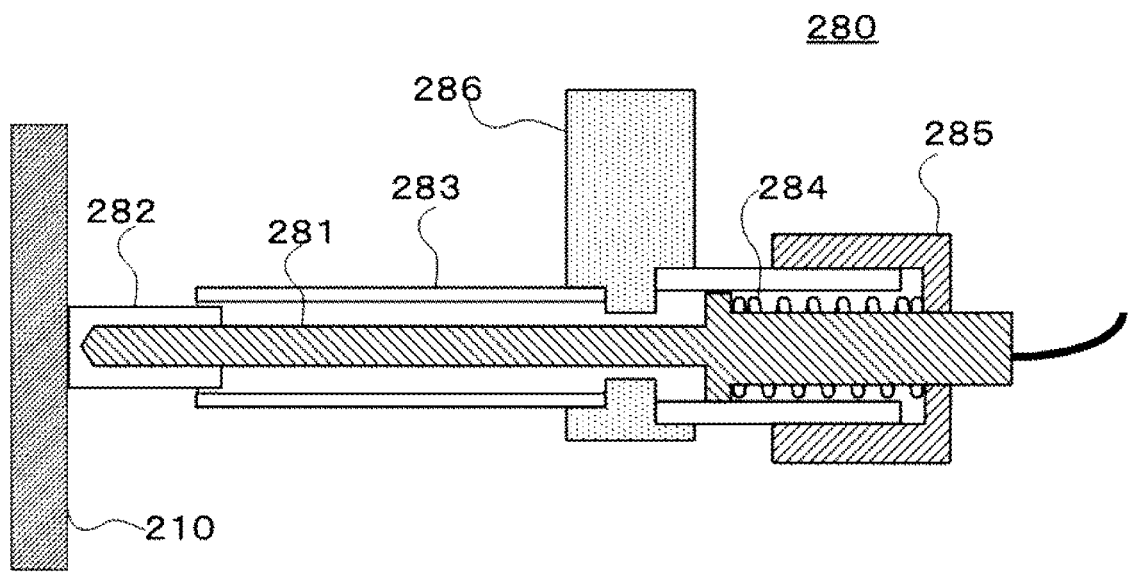
FIG. 4A schematically illustrates a configuration of a thermocouple mechanism according to the embodiments, and FIG. 4B schematically illustrates another configuration of the thermocouple mechanism according to the embodiments.

Subsequently, a more detailed configuration of the thermocouple mechanism 280 will be described with reference to FIG. 4A. For example, the thermocouple mechanism 280 is constituted by: a thermocouple 281; a metal block 282 made of a material such as aluminum and provided so as to cover a front end portion of the thermocouple 281 serving as a temperature detection point of the thermocouple 281; an outer tube 283 configured to accommodate the thermocouple 281 therein; a spring 284 serving as an elastic body and provided in contact with a flange portion of the thermocouple 281 inside the outer tube 283; a pressing component (also referred to as a "pressing member" or a "pressing part") 285 provided to press the spring 284 against the flange portion of the thermocouple 281; and a holding portion 286 configured to hold the outer tube 283 attached thereto. By providing the metal block 282 at the front end portion of the thermocouple 281, it is possible to expand a contact area between the thermocouple 281 and the upper vessel, and it is also possible to stabilize the contact between the thermocouple 281 and the outer peripheral surface of the upper vessel 210 by pressing the thermocouple 281 against the outer peripheral surface of the upper vessel 210 by the pressing mechanism constituted by the spring 284 and the pressing component 285. Thereby, it is possible to enhance the detection responsiveness by the thermocouple 281 with respect to the temperature change of the upper vessel 210.

Figure 4B:
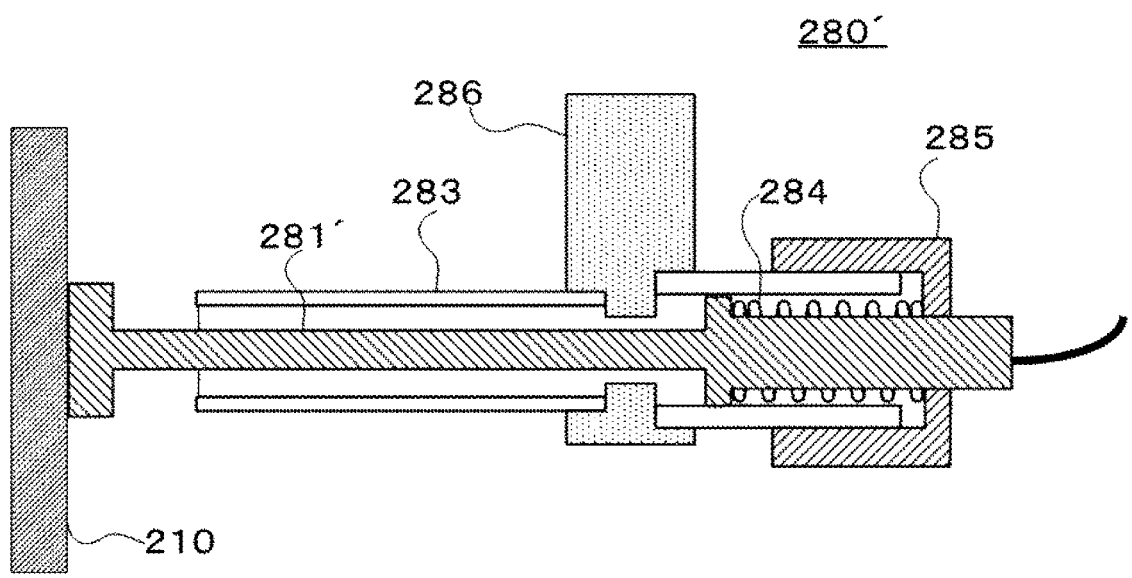

In addition, a configuration of the thermocouple mechanism 280', which is another example of the thermocouple mechanism 280, will be described with reference to FIG. 4B. The difference between the thermocouple mechanism 280' and the thermocouple mechanism 280 will be mainly described. The thermocouple mechanism 280' includes a thermocouple 281' integrated with a metal pad (also referred to as a "plate-shaped component") welded to a front end portion of the thermocouple 281'. By adopting a structure in which the metal pad is directly welded to the front end portion of the thermocouple 281', it is possible to expand a contact area between the thermocouple 281' and the upper vessel 210, and it is also possible to further reduce the distance between a temperature detection point of the thermocouple 281' and a contact surface between the thermocouple 281' and the upper vessel 210.

Controller

A controller 221 serving as a control device is configured to control each of components connected thereto via signal lines A through G shown in FIG. 1.

Figure 3:
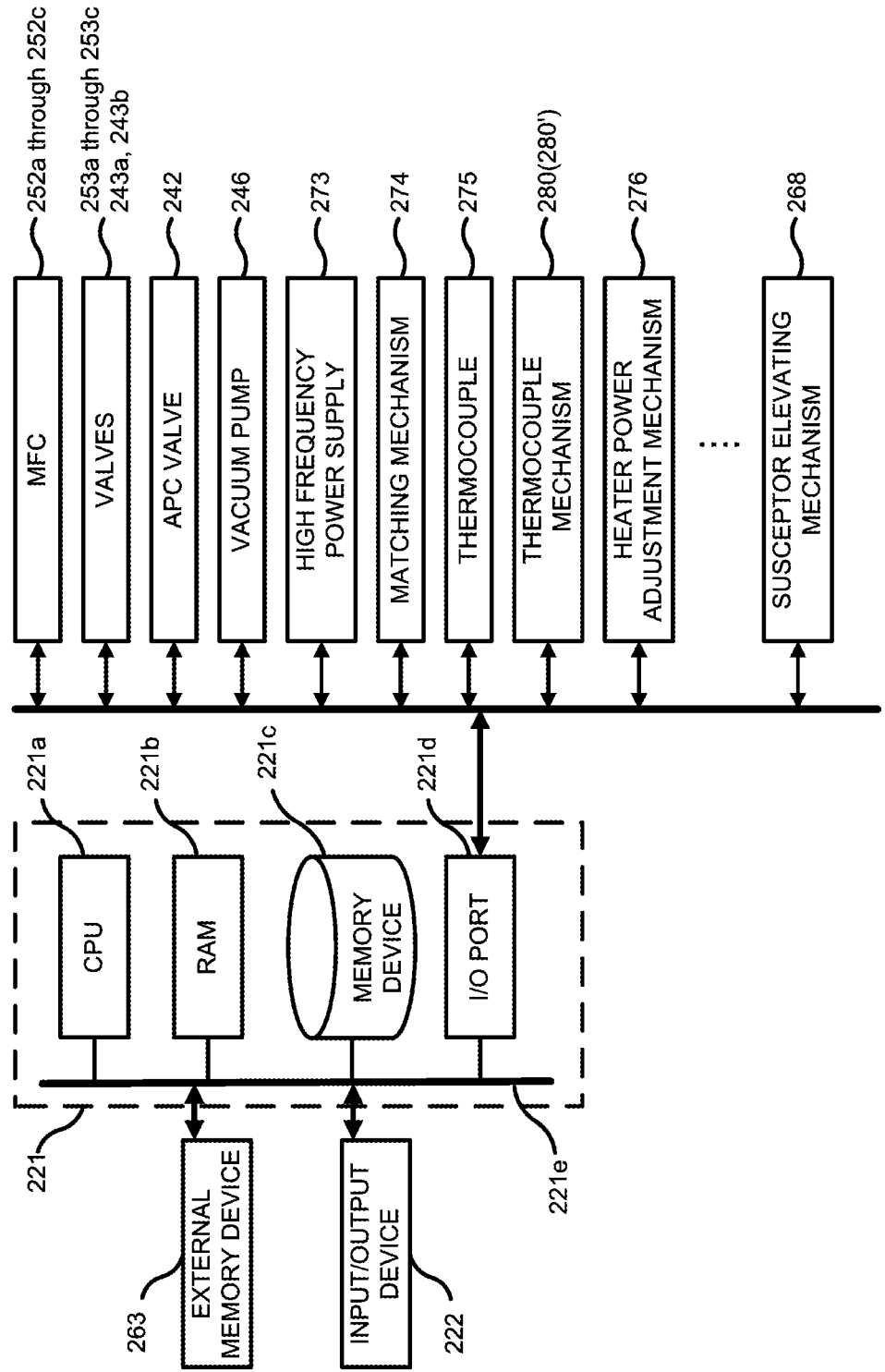
FIG. 3 is a block diagram schematically illustrating a configuration of a controller and related components of the substrate processing apparatus according to the embodiments described herein.

As shown in FIG. 3, the controller 221 serving as a control device (control mechanism) is embodied by a computer including a CPU (Central Processing Unit) 221a, a RAM (Random Access Memory) 221b, a memory device 221c and an I/O port 221d. The RAM 221b, the memory device 221c and the I/O port 221d may exchange data with the CPU 221a through an internal bus 221e. For example, an input/output device 222 such as a touch panel (not shown) and a display (not shown) may be connected to the controller 221.

The memory device 221c may be embodied by components such as a flash memory and a hard disk drive (HDD). Components such as a control program configured to control the operation of the substrate processing apparatus 100 and a process recipe in which information such as the order and the conditions of a substrate processing described later is stored may be readably stored in the memory device 221c. The process recipe is obtained by combining steps of the substrate processing described later such that the controller 221 can execute the steps to acquire a predetermine result, and functions as a program. Hereinafter, the process recipe and the control program are collectively referred to as a "program". In the present specification, the term "program"

may indicate only the process recipe, may indicate only the control program, or may indicate both of the process recipe and the control program. The RAM 221b functions as a memory area (work area) where a program or data read by the CPU 221a is temporarily stored.

As shown in FIG. 3, the I/O port 221d connects the controller 221 and each component constituting the substrate processing apparatus 100 via the signal lines A through G.

The CPU 221a is configured to read and execute the control program stored in the memory device 221c, and to read the process recipe stored in the memory device 221c in accordance with an instruction such as an operation command inputted via the input/output device 222. The CPU 221a is configured to control the operation of the substrate processing apparatus 100 according to the process recipe. For example, the CPU 221a may be configured to control the operations according to the process recipe, such as: adjusting the opening degree of the APC valve 242, opening/closing the valve 243b and starting and stopping the vacuum pump 246 through the signal line A; elevating/lowering the susceptor elevating mechanism 268 through the signal line B; adjusting an amount of power supply to the heater 217b by the heater power adjustment mechanism 276 through the signal line C; opening/closing the gate valve 244 through the signal line D; controlling the RF sensor 272, the matching mechanism 274 and the high frequency power supply 273 through the signal line E; and adjusting flow rates of various gases by the MFCs 252a, 252b and 252c and opening/closing the valves 253a, 253b, 253c and 243a through the signal line F. In addition, the CPU 221a is configured to acquire a temperature value measured by the thermocouple 275 through the signal line C and to acquire a temperature value measured by the thermocouple mechanism 280 through the signal line G in order to perform the contents of the read process recipe.

The controller 221 may be embodied by installing the above-described program stored in an external memory device 263 into a computer. For example, the external memory device 263 may include a magnetic tape, a magnetic disk such as a hard disk drive (HDD), an optical disk such as a CD, a magneto-optical disk such as MO, a semiconductor memory such as a USB memory. The memory device 221c or the external memory device 263 may be embodied by a non-transitory computer readable recording medium. Hereafter, the memory device 221c and the external memory device 263 may be collectively referred to as a "recording medium". In the present specification, the term "recording medium" may indicate only the memory device 221c, may indicate only the external memory device 263, and may indicate both of the memory device 221c and the external memory device 263. Instead of the external memory device 263, a communication means such as the Internet and a dedicated line may be used for providing the program to the computer.

(2) Substrate Processing

Figure 5:
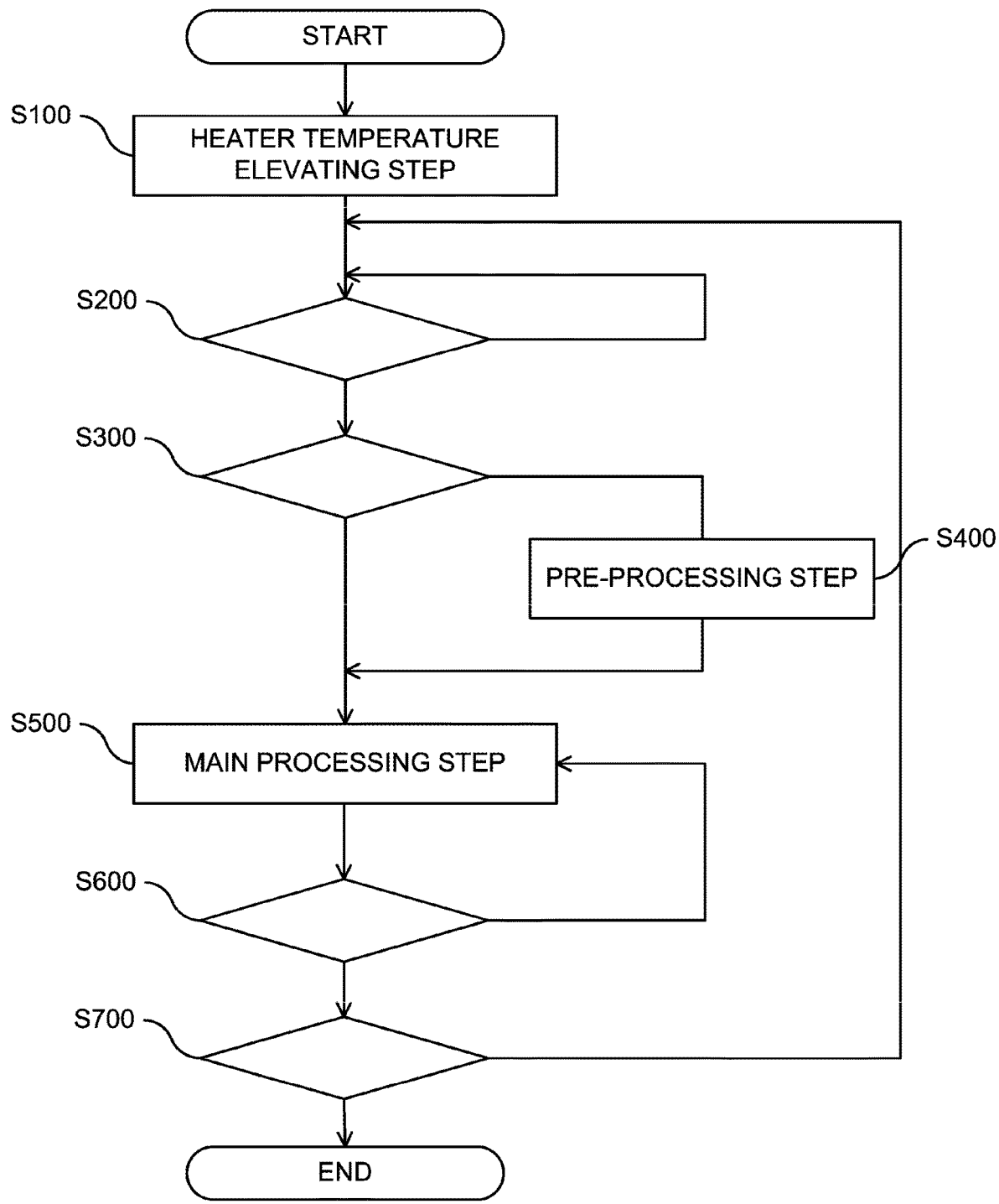
FIG. 5 is a flow chart schematically illustrating a substrate processing performed by the substrate processing apparatus according to the embodiments described herein.

Hereinafter, the substrate processing according to the first embodiment will be described. As shown in FIG. 5, the substrate processing according to the first embodiment is mainly constituted by: a pre-processing step (also referred to as a "plasma preheating step") S400 of generating the plasma discharge in the plasma generation space 201a so as to perform a heating process of heating the process chamber 201 (particularly, the upper vessel 210); and a main processing step (also referred to as a "product substrate processing step") S500 in which a product substrate is processed by performing an oxidation plasma process. The substrate processing according to the first embodiment is performed by the substrate processing apparatus 100 described above, as one of the manufacturing processes of the semiconductor device such as a flash memory.

Hereinafter, the substrate processing according to the first embodiment will be described with reference to FIGS. 5 through 7. In the following description of the substrate processing according to the first embodiment, the operations of the components of the substrate processing apparatus 100 are controlled by the controller 221.

(2-1) Heater Temperature Elevating Step (S100)

First, the electric power is supplied to the heater 217b so as to heat the susceptor 217. The heater 217b is controlled such that a temperature measured by the thermocouple 275 serving as a second temperature sensor is equal to or higher than a predetermined temperature (also referred to as a "second temperature"), more preferably, the temperature measured by the thermocouple 275 is equal to a target temperature higher than the second temperature or is within a target temperature range higher than the second temperature. Thereafter, the heater 217b continuously heats the susceptor 217 until the substrate processing is completed. For example, the target temperature (or the target temperature range) may be equal to a target temperature (or a target temperature range) of the heater 217b set in the main processing step S500. However, before the pre-processing step S400 is performed, the target temperature (or the target temperature range) of the heater temperature elevating step S100 may be set lower than that of the main processing step S500.

(2-2) Substrate Processing Instruction Waiting Step (Idling Step) (S200)

Subsequently, the substrate processing apparatus 100 waits (stands by) until an instruction of processing the substrate by executing the main processing step S500 is input to the substrate processing apparatus 100 via, for example, the input/output device 222. That is, the substrate processing apparatus 100 stands by in an idling state. Specifically, when the instruction is not input in the substrate processing instruction waiting step (also referred to as an "instruction input determination step") S200, the instruction input determination step S200 is performed again after a predetermined interval. When the instruction is input, the next step (a process vessel temperature determination step S300) is performed. An instruction indicating the number of substrates to be processed in the main processing step S500 (that is, the number of executions of the main processing step S500) is also input in the instruction of processing the substrate by executing the main processing step S500.

(2-3) Process Vessel Temperature Determination Step (S300)

Subsequently, in the process vessel temperature determination step S300, it is determined whether or not the temperature of the outer peripheral surface of the upper vessel 210 measured by the thermocouple mechanism 280 (or 280') serving as the first temperature sensor is equal to or higher than a predetermined temperature (also referred to as a "determination temperature"). When it is determined that the measured temperature is equal to or higher than the determination temperature, the main processing step S500 is performed. When it is determined that the measured temperature is lower than the determination temperature, the pre-processing step S400 is performed. The determination temperature will be described in detail separately.

(2-4) Main Processing Step (Product Substrate Processing Step) (S500)

In the main processing step S500, the oxidation plasma process serving as a modification process is performed to a silicon (Si) film formed on the surface of the wafer 200 serving as a product substrate so as to form a silicon oxide film ($SiO_2$ film). In the first embodiment, an example in which the oxidation plasma process is performed as the main processing step S500 will be described. However, the embodiments described herein may also be applied to other plasma processes such as a plasma process using other process gas and a plasma process for other target substrate or other type of target film.

Figure 6:
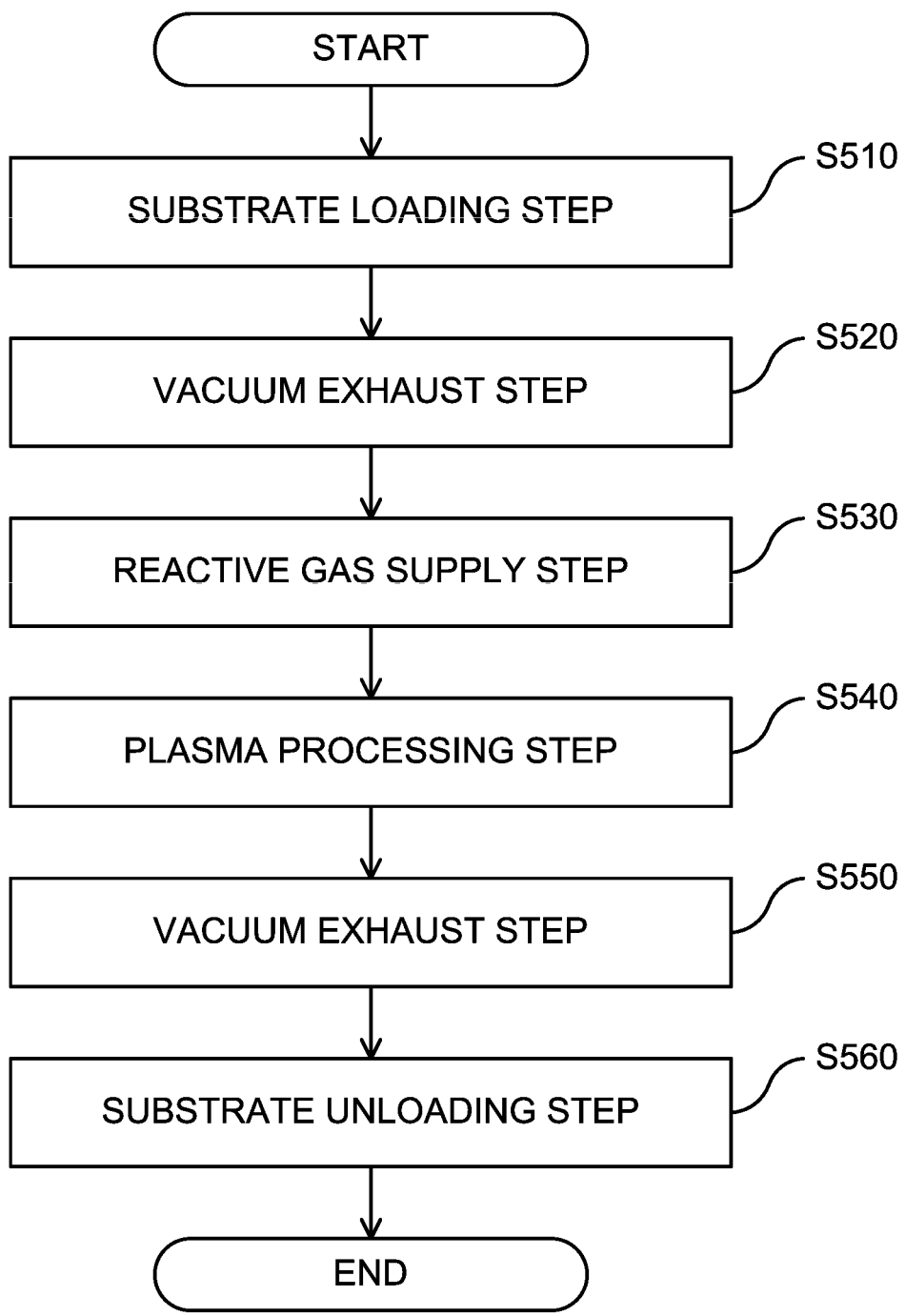
FIG. 6 is a flow chart schematically illustrating a main processing step of the substrate processing according to the embodiments described herein.
Figure 7:
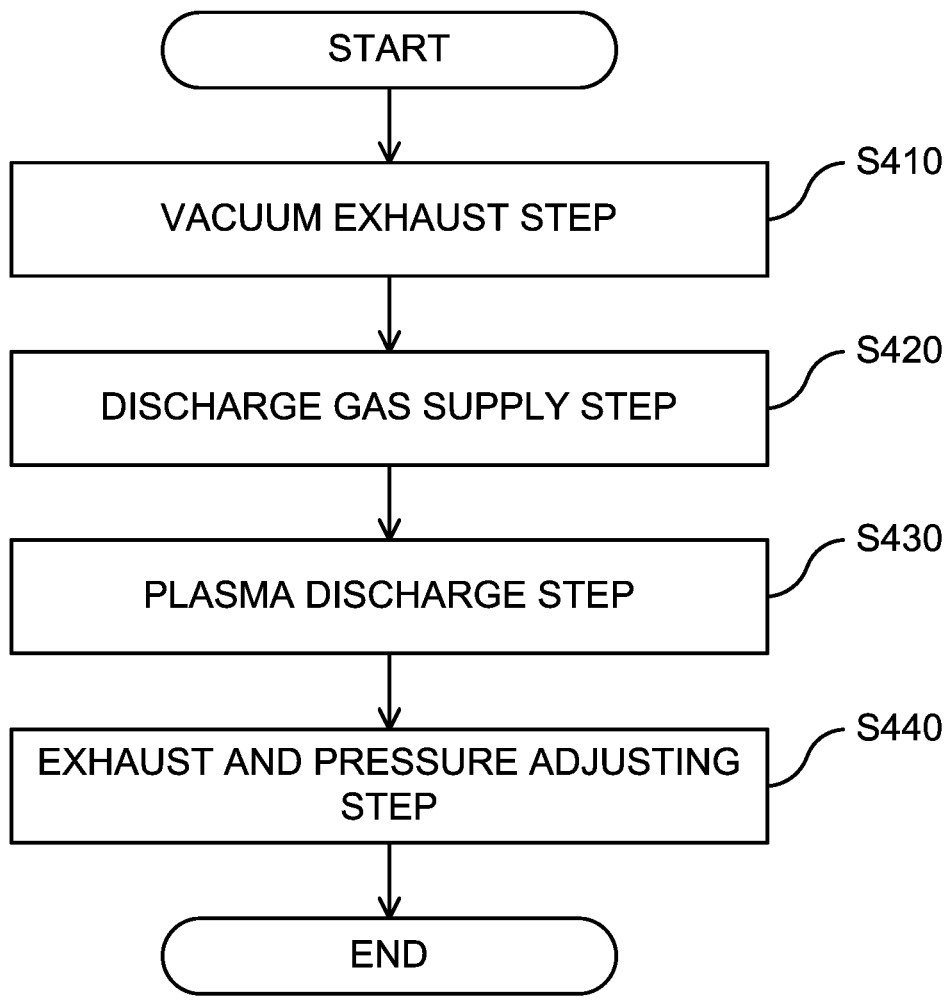
FIG. 7 is a flow chart schematically illustrating a pre-processing step of the substrate processing according to the embodiments described herein.

For example, as shown in FIG. 6, the main processing step S500 is constituted by a substrate loading step S510, a vacuum exhaust step S520, a reactive gas supply step S530, a plasma processing step S540, a vacuum exhaust step S550 and a substrate unloading step S560.

Substrate Loading Step S510

The susceptor 217 is lowered by the susceptor elevating mechanism 268 such that the wafer lift pins 266 protrude from the surface of the susceptor 217 by a predetermined height. Then, the wafer 200 is loaded into the process chamber 201 from a vacuum transfer chamber (not shown) provided adjacent to the process chamber 201 by a wafer transfer mechanism (not shown) such that the wafer 200 is placed on the wafer lift pins 266. Thereafter, the susceptor elevating mechanism 268 elevates the susceptor 217 such that the wafer 200 is placed on an upper surface of the susceptor 217 and supported by the susceptor 217.

Vacuum Exhaust Step S520

Subsequently, a temperature of the wafer 200 is elevated. The susceptor 217 is heated in advance by the heater 217b from the heater temperature elevating step S100. The heater 217b heats the wafer 200 placed on the susceptor 217 to a predetermined temperature. For example, the predetermined temperature of the wafer 200 may range from the 150° C. to 750° C. In the vacuum exhaust step S520, the predetermined temperature of the wafer 200 may be set to 600° C. The target temperature (or the target temperature range) of the heater 217b is set to a predetermined value such as the predetermined temperature of the wafer 200. However, the target temperature (or the target temperature range) of the heater 217b may be set to a value higher than the predetermined temperature of the wafer 200. In addition, while the temperature of the wafer 200 is elevated, the vacuum pump 246 vacuum-exhausts (evacuates) the inner atmosphere of the process chamber 201 through the gas exhaust pipe 231 such that an inner pressure of the process chamber 201 is at a predetermined pressure.

Reactive Gas Supply Step S530

Next, a mixed gas of the oxygen ($O_2$) gas serving as an oxygen-containing gas and a hydrogen ($H_2$) gas is supplied into the process chamber 201. The mixed gas serves as the reactive gas (also referred to as a "second process gas").

Specifically, the valves 253a and 253b are opened to supply the $O_2$ gas and the $H_2$ gas into the process chamber 201 while the flow rates of the $O_2$ gas and the $H_2$ gas are adjusted by the MFCs 252a and 252b, respectively. In the reactive gas supply step S530, for example, the flow rate of the $O_2$ gas is set to a predetermined flow rate ranging from 20 sccm to 2,000 sccm, and the flow rate of the $H_2$ gas is set to a predetermined flow rate ranging from 20 sccm to 1,000 sccm. The opening degree of the APC valve 242 is adjusted such that the inner pressure of the process chamber 201 is at a predetermined pressure ranging from 50 Pa to 200 Pa. The reactive gas is continuously supplied into the process chamber 201 until the plasma processing step S540 described later is completed.

Plasma Processing Step S540

Next, the high frequency power is applied to the resonance coil 212 from the high frequency power supply 273. For example, the high frequency power supplied to the resonance coil 212 is set to a predetermined power ranging from 100 W to 5,000 W, preferably, from 100 W to 3,500 W, more preferably, from 1,000 W to 3,500 W. In order to generate the plasma discharge stably, it is preferable that the high frequency power is 1,000 W or more. When the high frequency power is lower than 100 W, it is difficult to generate the plasma discharge stably.

As a result, a high frequency electric field is formed in the plasma generation space 201a to which the $O_2$ gas and the $H_2$ gas are supplied, and the induction plasma is excited. The $O_2$ gas and the $H_2$ gas are activated into plasma states by the excited plasma, and dissociate. As a result, reactive species such as oxygen radicals (oxygen active species) containing oxygen (O), oxygen ions, hydrogen radicals (hydrogen active species) containing hydrogen (H) and hydrogen ions are generated.

The reactive species such as the oxygen radicals and the hydrogen radicals generated by the induction plasma are supplied onto the surface of the wafer 200. The reactive species supplied onto the surface of the wafer 200 react uniformly with the silicon film formed on the surface of the wafer 200 to modify a surface of the silicon film into a silicon oxide ($SiO_2$) layer.

After a predetermined process time elapses, for example, after 10 seconds to 300 seconds elapse, the output of the electric power from the high frequency power supply 273 is stopped to stop the plasma discharge in the process chamber 201. In addition, the supply of the reactive gas into the process chamber 201 is stopped.

Vacuum Exhaust Step S550

Thereafter, the inner atmosphere of the process chamber 201 such as the reactive gas in the process chamber 201 is exhausted by using the gas exhaust pipe 231. Thereafter, the opening degree of the APC valve 242 is adjusted such that the inner pressure of the process chamber 201 is adjusted to the same pressure as that of the vacuum transfer chamber (not shown) provided adjacent to the process chamber 201.

Substrate Unloading Step S560

After the inner pressure of the process chamber 201 reaches a predetermined pressure, the susceptor 217 is lowered to a transfer position of the wafer 200 until the wafer 200 is supported by the wafer lift pins 266. Then, the wafer 200 is unloaded out of the process chamber 201 by using the transfer mechanism (not shown). Thereby, the oxidation plasma process serving as the main processing step S500 according to the first embodiment is completed.

(2-5) Repeat Count Determination Step (S600)

After the main processing step S500 is completed, it is determined whether or not the processing according to the main processing step S500 is completed for the substrates to be processed by referring to the instruction indicating the number of substrates to be processed (that is, the number of executions of the main processing step S500) input in the substrate processing instruction waiting step S200. When it is determined that the processing is completed, the next step S700 is performed. When it is determined that the processing is not completed, the main processing step S500 is performed again on other substrate to be processed.

(2-6) Apparatus Operation Stop Determination Step (S700)

When an instruction to stop the operation of the substrate processing apparatus 100 is input after the repeat count determination step S600 is completed, the operation of the substrate processing apparatus 100 is stopped and the substrate processing is terminated. When the instruction to stop the operation of the substrate processing apparatus 100 is not input, the substrate processing instruction waiting step S200 and the subsequent steps are performed again.

(2-7) Pre-Processing Step (Plasma Preheating Step) (S400)

Hereinafter, the pre-processing step S400 will be described. The pre-processing step S400 is performed before the main processing step S500 in order to heat components constituting the process chamber 201, particularly the upper vessel 210.

Figure 8:
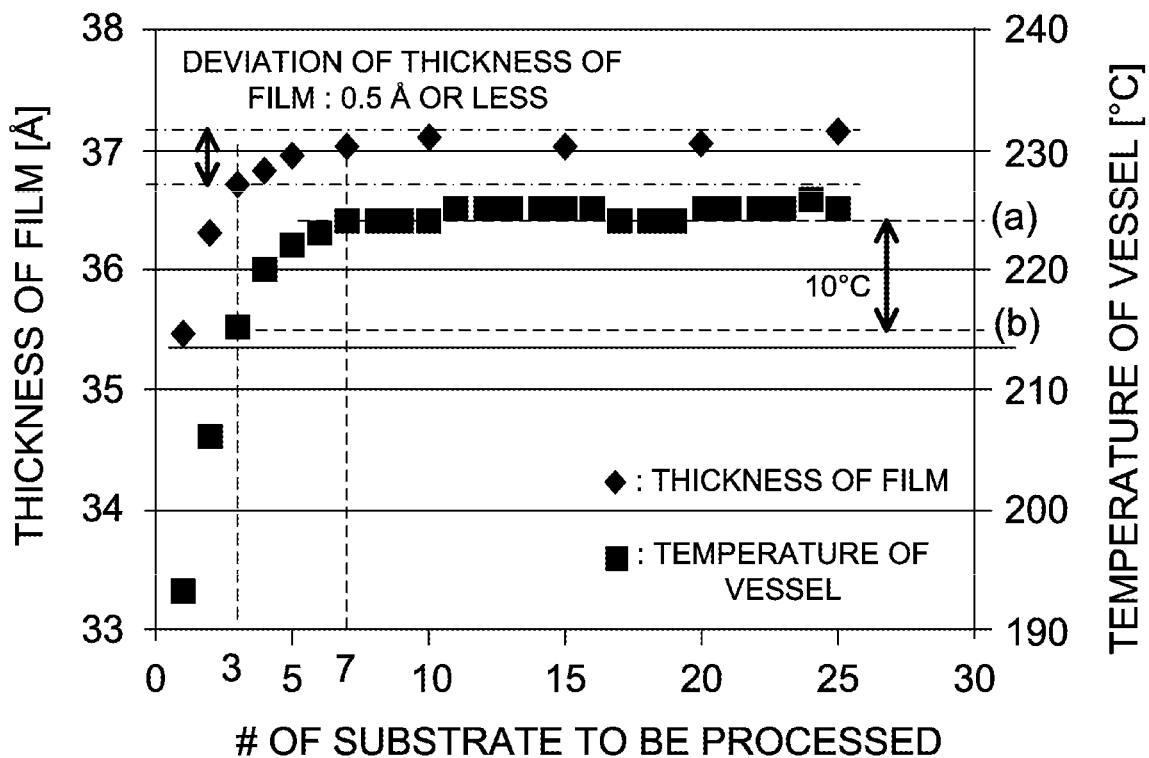
FIG. 8 is a diagram plotting a temperature of an upper vessel and a thickness of a film formed on a substrate according to a comparative example (experimental example) without performing the pre-processing step.

First, the necessity of performing the pre-processing step S400 will be described. FIG. 8 is a diagram plotting the temperature of the upper vessel 210 (that is, the measured temperature of the thermocouple mechanism 280) and the thickness of the $SiO_2$ film formed by performing the main processing step S500 according to a comparative example (also referred to as an "experimental example"). According to the comparative example, the pre-processing step S400 is not performed such that the upper vessel 210 is not heated, and the main processing step S500 is sequentially repeated on each of 25 substrates to be processed to form the $SiO_2$ film thereon. According to the results of the experimental example, the disclosers of the present application found that the thickness of the film formed by performing the main processing step S500 depends not only on the temperature of the substrate (that is, the wafer 200) but also on the temperature of the upper vessel 210.

The temperature of the upper vessel 210 reaches a stable temperature (also referred to as a "steady temperature") by repeatedly performing the main processing step S500. Thereafter, the thickness of the $SiO_2$ film is also stabilized. According to the experimental example, the stable temperature (about 224° C. as indicated by "(a)" shown in FIG. 8) is reached when the seventh substrate among the 25 substrates is processed. However, until the temperature of the upper vessel 210 reaches the stable temperature, the thickness of the $SiO_2$ film is lower before stabilized than after stabilized. As a result, it is difficult to form the $SiO_2$ film with a stable thickness on all the substrates from the first substrate.

According to the pre-processing step S400, by generating the plasma discharge in the plasma generation space 201a prior to the main processing step S500 of processing the product substrate, the components constituting the process chamber 201 such as the upper vessel 210 is heated until the temperature of the components constituting the process chamber 201 reaches a temperature at which the thickness of the film formed in the main processing step S500 is stabilized. Thereby, it is possible to form the film with a stable thickness on all the substrates from the first substrate in the main processing step S500.

In addition, when a structure such as the resonance coil 212 for plasma excitation is provided on an outer periphery of the process vessel 203 which constitutes a part of the process chamber 201 of the substrate processing apparatus 100, it is difficult to provide a heater of heating the process vessel 203 on the outer periphery of the process vessel 203 due to space limitations. Therefore, it is one of the most preferable to perform the heating process using the plasma discharge as means of heating the process vessel 203 itself according to the apparatus configuration of the first embodiment.

Hereinafter, each of the steps constituting the pre-processing step S400 will be described with reference to FIG. 7. In addition, the pre-processing step S400 may be performed in a state where the wafer 200 serving as a dummy substrate is placed on the susceptor 217. However, the first embodiment will be described by way of an example in which the dummy substrate is not used.

Vacuum Exhaust Step S410

First, the vacuum pump 246 vacuum-exhausts the inner atmosphere of the process chamber 201 such that the inner pressure of the process chamber 201 is at a predetermined pressure. The vacuum pump 246 continuously vacuum-exhausts the inner atmosphere of the process chamber 201 until at least an exhaust and pressure adjusting step S440 described later is completed. The heater 217b is controlled to heat the susceptor 217 continuously from the heater temperature elevating step S100.

Discharge Gas Supply Step S420

Next, a mixed gas of the $O_2$ gas and the $H_2$ gas serving as a discharge gas (also referred to as a "first process gas") is supplied into the process chamber 201 in the same manner as the reactive gas (the second process gas) in the main processing step S500. The conditions such as specific gas supply procedures, the flow rates of the gases supplied into the process chamber 201 and the inner pressure of the process chamber 201 are the same as those in the main processing step S500.

For the purpose of promoting the plasma discharge in a plasma discharge step S430 described later, other gas such as argon (Ar) gas may be supplied with the discharge gas, or at least one among the $O_2$ gas and the $H_2$ gas may not be supplied. In addition, conditions such as the flow rates of the gases supplied into the process chamber 201 and the inner pressure of the process chamber 201 may be set differently. However, it is one of the most preferable to use the same discharge gas as the reactive gas of the main processing step S500 since it brings the environment in the process chamber 201 closer to a stable state of the main processing step S500 in addition to heating the upper vessel 210.

Plasma Discharge Step S430

Next, the high frequency power from the high frequency power supply 273 is applied to the resonance coil 212. The magnitude of the high frequency power supplied to the resonance coil 212 is the same as that of the high frequency power in the main processing step S500. However, the magnitude of the high frequency power may be greater than that of the high frequency power in the main processing step S500 in order to promote the plasma discharge, and may vary within a range from 100 W to 5,000 W in accordance with other processing conditions.

As a result, the plasma discharge is generated intensively in the plasma generation space 201a, particularly at the height of the upper end, the middle point and lower end of the resonance coil 212. The generated plasma discharge heats the upper vessel 210 from the inside of the upper vessel 210. In particular, portions of the upper vessel 210 corresponding to the above-described height where the plasma discharge is generated intensively and the vicinity thereof are heated intensively.

The controller 221 is configured to measure (monitor) the temperature of the outer peripheral surface of the upper vessel 210 by the thermocouple mechanism 280 at least during the plasma discharge step S430, and the controller 221 is configured to continuously apply the high frequency power to the resonance coil 212 to maintain the plasma discharge until the measured temperature is equal to or higher than a predetermined temperature (also referred to as a "first temperature"). When detecting that the measured temperature is equal to or higher than the first temperature, the controller 221 is configured to stop the supply of the high frequency power from the high frequency power supply 273 and to stop the supply of the discharge gas into the process chamber 201 so as to complete the plasma discharge step S430. In addition, although the first temperature in the plasma discharge step S430 is the same as the determination temperature determined in the process vessel temperature determination step S300, the determination temperature may be set to be higher than the first temperature.

Hereinafter, the first temperature will be described in detail. A first setting example of the first temperature is to set the first temperature as a stable temperature of the measured temperature of the thermocouple mechanism 280 (that is, the temperature of the outer peripheral surface of the upper vessel 210). That is, for example, as in the experimental example described above shown in FIG. 8, the main processing step S500 is continuously performed in advance to obtain the stable temperature (also referred to as a "stable temperature value") at that time, and the stable temperature value is set as the first temperature. When the stable temperature of the experimental example shown in FIG. 8 is applied, the stable temperature (indicated by "(a)" shown in FIG. 8) of 224° C. is set as the first temperature. In the first embodiment, the stable temperature ("(a)") is set as the first temperature.

In addition, in a second setting example of the first temperature, a value of a measured temperature range (for example, a lower limit value of the range) where the deviation of the thickness of the film formed in the main processing step S500 is equal to or less than a predetermined deviation (also referred to as a "predetermined variation") is set as the first temperature. That is, for example, when the predetermined deviation of the thickness of the film is set to be 0.5 Å or less, it is confirmed that according to the experimental example shown in FIG. 8 the deviation of the thickness of the film is converged to 0.5 Å or less when the main processing step S500 is performed three times or more (that is, the third and its subsequent substrates are processed by the main processing step S500). Accordingly, any one of the following may be set as the first temperature: the measured temperature values in the main processing steps S500 for the third substrate and the subsequent substrates; a predetermined value equal to or higher than the third measured temperature (also referred to as a "lower limit temperature" as indicated by "(b)" shown in FIG. 8) which is the lowest measured temperature; and a predetermined value between the stable temperature ("(a)") and the lower limit temperature ("(b)").

As described above, by generating the plasma discharge until the measured temperature of the thermocouple mechanism 280 is equal to or higher than the first temperature so as to heat the components such as the upper vessel 210, it is possible to maintain the thickness of the film formed in the main processing step S500 following the pre-processing step S400 within a predetermined deviation range.

Exhaust and Pressure Adjusting Step S440

The gas in the process chamber 201 is exhausted out of the process chamber 201. Thereafter, the opening degree of the APC valve 242 is adjusted so that the inner pressure of the process chamber 201 is the same as the pressure of the vacuum transfer chamber. As a result, the pre-processing step S400 is completed, and the main processing step S500 is subsequently performed.

Effect According to First Embodiment

Figure 9:
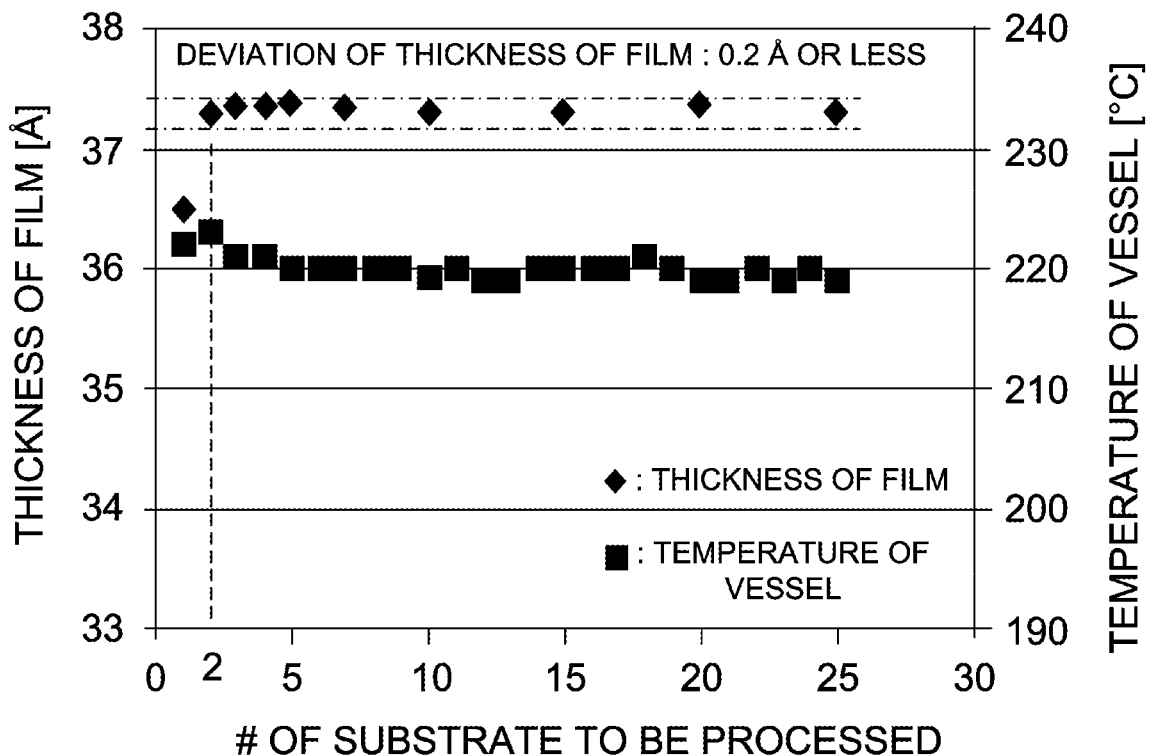
FIG. 9 is a diagram plotting the temperature of the upper vessel and the thickness of the film formed on the substrate according the embodiments with performing the pre-processing step.

FIG. 9 is a diagram plotting the temperature of the upper vessel 210 and the thickness of the $SiO_2$ film formed by performing the main processing step S500 according to an example of the first embodiment. According to the example of the first embodiment, the pre-processing step S400 is performed such that the upper vessel 210 is pre-heated, and the main processing step S500 is sequentially repeated on each of 25 substrates to be processed to form the $SiO_2$ film thereon. According to the example of the first embodiment, the first temperature in the pre-processing step S400 is set to 220° C.

According to the example of the first embodiment, it is confirmed that the temperature of the upper vessel 210 is stable at around 220° C. from when the first substrate among the 25 substrates is subjected to the main processing step S500. It is also confirmed that the deviation of the thickness of the $SiO_2$ film is stable within a range of 0.2 Å or less after the second substrate is subjected to the main processing step S500. That is, according to the example of the first embodiment, it is possible to form the $SiO_2$ film with a stable thickness on all of the second and its subsequent substrates to be processed.

Second Embodiment of Present Disclosure

Subsequently, a second embodiment of the present disclosure will be described. In the pre-processing step S400 according to the first embodiment, the plasma discharge step S430 is continuously performed until the measured temperature of the thermocouple mechanism 280 is equal to or higher than the first temperature. However, in the pre-processing step S400 according to the second embodiment, the plasma discharge is intermittently performed one or more times.

Specifically, after the discharge gas supply step S420, an intermittent discharge step that is a subset of the plasma discharge step S430 is performed so that the high frequency power is applied to the resonance coil 212 to generate the plasma discharge. After a predetermined time (for example, 1 minute to 2 minutes) elapses, the application of the high frequency power is stopped. The controller 221 measures the temperature of the upper vessel 210 by the thermocouple mechanism 280 at least during the intermittent discharge step, and determines whether or not the measured temperature is equal to or higher than the first temperature during or after the intermittent discharge step. When detecting that the measured temperature is equal to or higher than the first temperature, the controller 221 stops the supply of the high frequency power to stop the supply of the discharge gas into the process chamber 201, and to terminate the plasma discharge step S430. When the measured temperature is lower than the first temperature, the controller 221 performs the intermittent discharge step again, and thereafter repeats the intermittent discharge step until the measured temperature is equal to or higher than the first temperature.

A purge step of exhausting the gas in the process chamber 201 out of the process chamber 201 may be performed between each of intermittent discharge steps repeatedly performed. In addition, when it is detected that the measured temperature is equal to or higher than the first temperature during the execution of each of the intermittent discharge steps, the intermittent discharge step may be stopped and the plasma discharge step S430 may be terminated.

Third Embodiment of Present Disclosure

Subsequently, a third embodiment of the present disclosure will be described. According to the first embodiment, the first temperature which is set in the substrate processing instruction waiting step S200 and the pre-processing step S400 is a predetermined value acquired in advance, for example, through experiments. However, according to the third embodiment, a value of the first temperature may be updated during the operation of the substrate processing apparatus 100.

According to the third embodiment, for example, the temperature obtained from the thermocouple mechanism 280 at the time when the main processing step S500 has been continuously and repeatedly performed a predetermined number (for example, 20 or more) of times (that is, a temperature that can be regarded as the stable temperature) is set as the first temperature. In addition, the set value serving as the first temperature may be stored, for example, on the RAM 221b of the controller 221, and the set value may be updated in the controller 221.

According to some embodiments in the present disclosure, it is possible to provide the technique capable of: suppressing variations in a processing rate between a plurality of substrates to be processed; suppressing a decrease in the processing rate due to a temperature of a process vessel constituting a process chamber of a substrate processing apparatus using plasma; and improving the quality of the semiconductor device.

What is claimed is:
1. A substrate processing apparatus comprising:
  a process vessel constituting at least a part of a process chamber where a substrate is processed;
  a plasma generator comprising a coil provided to be wound around an outer periphery of the process vessel and a high frequency power supply configured to supply high frequency power to the coil;
  a substrate support provided in the process chamber and below a lower end of the coil;
  a heater provided in the substrate support;
  a temperature sensor configured to measure a temperature of a portion of the process vessel located above an upper end of the coil;
  a gas supply system configured to supply a first process gas and a second process gas into the process vessel; and
  a controller configured to control the gas supply system and the plasma generator to perform: (a) supplying the first process gas into the process vessel; (b) generating a plasma of the first process gas supplied into the process vessel by supplying the high frequency power to the coil until a temperature measured by the temperature sensor is equal to or higher than a first temperature; (c) placing the substrate on the substrate support after (b); (d) supplying the second process gas into the process vessel; and (e) generating a plasma of the second process gas supplied into the process vessel by supplying the high frequency power to the coil and processing the substrate placed on the substrate support by the plasma of the second process gas.

2. The substrate processing apparatus of claim 1, wherein the controller is further configured to control the plasma generator to, in (b), intermittently start and stop supplying the high frequency power to the coil once or repeatedly a plurality of times until the temperature measured by the temperature sensor is equal to or higher than the first temperature.

3. The substrate processing apparatus of claim 1, wherein the controller is further configured to obtain a temperature measured by the temperature sensor after (c) through (e) are repeatedly performed a predetermined number of times, and store an obtained temperature in a memory device as the first temperature.

4. The substrate processing apparatus of claim 1, wherein the controller is further configured to control the heater so as to heat the substrate support in all of (a) through (e).

5. The substrate processing apparatus of claim 1, further comprising: a second temperature sensor configured to measure a temperature of at least one among the heater and the substrate support, and
  the controller is further configured to control the heater such that a temperature measured by the second temperature sensor is equal to or higher than a second temperature in (a) through (e).

6. The substrate processing apparatus of claim 5, wherein the controller is further configured to perform: (f) elevating the temperature of at least one among the heater and the substrate support by the heater such that the temperature measured by the second temperature sensor is equal to or higher than the second temperature before (a).

7. The substrate processing apparatus of claim 1, wherein the high frequency power supply is further configured to supply the coil with the high frequency power whose wavelength is an integral multiple of an electrical length of an inductive coupling structure comprising the coil.

8. The substrate processing apparatus of claim 1, wherein the controller is further configured to control the high frequency power supply to supply the coil with the high frequency power whose frequency range is a resonance frequency of an inductive coupling structure comprising the coil.

9. The substrate processing apparatus of claim 1, wherein the controller is further configured to control the high frequency power supply such that a ring-shaped plasma is generated at a height of the upper end of the coil in (b).

10. The substrate processing apparatus of claim 1, wherein the process vessel comprises a dome-shaped or a cylinder-shaped vessel made of quartz.

11. The substrate processing apparatus of claim 1, wherein the temperature sensor is provided to measure a temperature of an outer peripheral surface of the process vessel.

12. The substrate processing apparatus of claim 11, wherein the temperature sensor comprises: a thermocouple; and a pressing mechanism configured to press a temperature detection point of the thermocouple against the outer peripheral surface of the process vessel.

13. The substrate processing apparatus of claim 12, wherein a front end portion of the thermocouple is constituted by a plate-shaped component with a surface facing the outer peripheral surface of the process vessel.

14. The substrate processing apparatus of claim 1, wherein the first process gas is same as the second process gas.

15. A substrate processing apparatus comprising:
   a process vessel constituting at least a part of a process chamber where a substrate is processed;
   a plasma generator comprising a coil provided to be wound around an outer periphery of the process vessel and a high frequency power supply configured to supply high frequency power to the coil;
   a substrate support provided in the process chamber and below a lower end of the coil;
   a heater provided in the substrate support; and
   a temperature sensor configured to measure a temperature of a portion of the process vessel located above an upper end of the coil,
   wherein the temperature sensor is provided so as to measure the temperature of the process vessel at a predetermined height of 15 mm or more and 30 mm or less from the upper end of the coil.

16. A method of manufacturing a semiconductor device comprising:
   (a) providing a substrate processing apparatus comprising:
      a process vessel constituting at least a part of a process chamber where a substrate is processed;
      a plasma generator comprising a coil provided to be wound around an outer periphery of the process vessel and a high frequency power supply configured to supply high frequency power to the coil;
      a substrate support provided in the process chamber and below a lower end of the coil;
      a heater provided in the substrate support; and
      a temperature sensor configured to measure a temperature of a portion of the process vessel located above an upper end of the coil;
   (b) supplying a first process gas into the process vessel;
   (c) generating a plasma of the first process gas supplied into the process vessel by supplying the high frequency power to the coil while measuring the temperature of the portion of the process vessel located above the upper end of the coil by the temperature sensor until the temperature measured by the temperature sensor is equal to or higher than a first temperature;
   (d) placing the substrate on the substrate support after (c);
   (e) supplying a second process gas into the process vessel; and
   (f) generating a plasma of the second process gas supplied into the process vessel by supplying the high frequency power to the coil and processing the substrate placed on the substrate support by the plasma of the second process gas.

* * * * *